(12) United States Patent
Wezelenburg et al.

(10) Patent No.: US 7,936,290 B2
(45) Date of Patent: May 3, 2011

(54) DYNAMIC SELECTION OF SUITABLE CODES FOR VARIABLE LENGTH CODING AND DECODING

(75) Inventors: Martinus Cornelis Wezelenburg, Kessel-Lo (BE); Jeremy Piers Davies, Cambridge (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 12/588,926

(22) Filed: Nov. 2, 2009

(65) Prior Publication Data
US 2010/0134331 A1    Jun. 3, 2010

(30) Foreign Application Priority Data
Dec. 1, 2008   (GB) .................................. 0821922.2

(51) Int. Cl.
H03M 7/40   (2006.01)
(52) U.S. Cl. ............ 341/67; 341/65; 341/106; 341/107; 375/240.14; 375/240.15; 375/240.24; 382/232; 382/236; 382/239; 382/246; 382/248
(58) Field of Classification Search ............ 341/65, 341/67, 106, 107; 375/240.14, 240.15, 240.16, 375/240.24; 382/232, 236, 239, 246, 248
See application file for complete search history.

(56) References Cited

U.S. PATENT DOCUMENTS

| | | | |
|---|---|---|---|
| 5,884,269 A | | 3/1999 | Cellier et al. |
| 6,265,997 B1 * | | 7/2001 | Nomizu .......................... 341/107 |
| 6,484,142 B1 * | 11/2002 | Miyasaka et al. .............. 704/500 |
| 6,493,385 B1 * | 12/2002 | Sekiguchi et al. ........ 375/240.03 |
| 6,624,761 B2 * | 9/2003 | Fallon ............................. 341/51 |
| 6,711,295 B2 * | 3/2004 | Nakayama et al. ............ 382/232 |
| 7,015,837 B1 * | 3/2006 | Malvar ............................. 341/59 |
| 7,068,192 B1 * | 6/2006 | Dean et al. ...................... 341/67 |
| 7,113,115 B2 * | 9/2006 | Partiwala et al. ............... 341/67 |
| 7,245,235 B2 * | 7/2007 | Malvar ............................ 341/51 |
| 7,248,190 B2 * | 7/2007 | Kadono et al. .................. 341/67 |
| 7,281,771 B1 * | 10/2007 | Wen et al. ...................... 341/107 |
| 7,378,992 B2 * | 5/2008 | Fallon ............................ 341/51 |
| 7,454,073 B2 * | 11/2008 | Chen et al. .................... 382/239 |

FOREIGN PATENT DOCUMENTS

EP    0 762 771    3/1997
WO    WO 2007/035070    3/2007

OTHER PUBLICATIONS

UK Search Report dated Mar. 13, 2009 for GB 0821922.2.

* cited by examiner

*Primary Examiner* — Linh V Nguyen
(74) *Attorney, Agent, or Firm* — Nixon & Vanderhye P.C.

(57) ABSTRACT

A data compressor for compressing a data signal and a corresponding data decompressor are disclosed. The data compressor comprises: compression circuitry for compressing said data signal using a plurality of variable length compression codes; a digital code select signal generator for generating a digital code select signal from an indicator signal indicative of a preferred compression distribution, a frequency of said digital code select signal being higher than a frequency of said indicator signal and an average value of said digital code select signal corresponding to an average value of said indicator signal; said compression circuitry being responsive to said digital code select signal to select between one of said plurality of compression codes in dependence upon a current value of said digital code select signal and to compress said data signal using said selected compression code.

31 Claims, 9 Drawing Sheets

Huffman-optimal code-tree with 1-bit per zero assignment

Huffman-optimal code-tree with 2-bit per zero assignment

| | 0 | 0.5 | 0.75 | 1 | 1.5 | 2 |
|---|---|---|---|---|---|---|
| | 1 | 2.5 | 2.5 | 3 | 3 | 3 |
| | -1 | 2.5 | 2.5 | 3 | 3 | 3 |
| | 2 | 7 | 6 | 5 | 4.5 | 4 |
| | -2 | 7 | 6 | 5 | 4.5 | 4 |
| | 3 | 7 | 6 | 5 | 5 | 5 |
| | -3 | 7 | 6 | 5 | 5 | 5 |
| | 4 | 9 | 8 | 7 | 6 | 5 |
| | -4 | 9 | 8 | 7 | 6 | 5 |
| | 5 | 9 | 8 | 7 | 6.5 | 6 |
| | -5 | 9 | 8 | 7 | 6.5 | 6 |
| | 6 | 9 | 8 | 7 | 6.5 | 6 |
| | -6 | 9 | 8 | 7 | 6.5 | 6 |
| | 7 | 9 | 8 | 7 | 7 | 7 |
| | -7 | 9 | 8 | 7 | 7 | 7 |
| | 8 | 11 | 10 | 9 | 8 | 7 |
| | -8 | 11 | 10 | 9 | 8 | 7 |
| | 9 | 11 | 10 | 9 | 8 | 7 |
| | -9 | 11 | 10 | 9 | 8 | 7 |
| | 10 | 11 | 10 | 9 | 8 | 7 |
| | -10 | 11 | 10 | 9 | 8 | 7 |
| | 11 | 11 | 10 | 9 | 8.5 | 8 |
| | -11 | 11 | 10 | 9 | 8.5 | 8 |
| | 12 | 11 | 10 | 9 | 8.5 | 8 |
| | -12 | 11 | 10 | 9 | 8.5 | 8 |
| | 13 | 11 | 10 | 9 | 8.5 | 8 |
| | -13 | 11 | 10 | 9 | 8.5 | 8 |
| | 14 | 11 | 10 | 9 | 8.5 | 8 |
| | -14 | 11 | 10 | 9 | 8.5 | 8 |
| | 15 | 11 | 10 | 9 | 9 | 9 |
| | -15 | 11 | 10 | 9 | 9 | 9 |
| | 16 | 13 | 12 | 11 | 10 | 9 |
| | -16 | 13 | 12 | 11 | 10 | 9 |
| | 17 | 13 | 12 | 11 | 10 | 9 |
| | -17 | 13 | 12 | 11 | 10 | 9 |
| | 18 | 13 | 12 | 11 | 10 | 9 |
| | -18 | 13 | 12 | 11 | 10 | 9 |
| | 19 | 13 | 12 | 11 | 10 | 9 |
| | -19 | 13 | 12 | 11 | 10 | 9 |
| | 20 | 13 | 12 | 11 | 10 | 9 |
| | -20 | 13 | 12 | 11 | 10 | 9 |
| | 21 | 13 | 12 | 11 | 10 | 9 |
| | -21 | 13 | 12 | 11 | 10 | 9 |
| | 22 | 13 | 12 | 11 | 10 | 9 |
| | -22 | 13 | 12 | 11 | 10 | 9 |
| | 23 | 13 | 12 | 11 | 10.5 | 10 |
| | -23 | 13 | 12 | 11 | 10.5 | 10 |
| | 24 | 13 | 12 | 11 | 10.5 | 10 |
| | -24 | 13 | 12 | 11 | 10.5 | 10 |
| | 25 | 13 | 12 | 11 | 10.5 | 10 |
| | -25 | 13 | 12 | 11 | 10.5 | 10 |
| | 26 | 13 | 12 | 11 | 10.5 | 10 |
| | -26 | 13 | 12 | 11 | 10.5 | 10 |
| | 27 | 13 | 12 | 11 | 10.5 | 10 |
| | -27 | 13 | 12 | 11 | 10.5 | 10 |
| | 28 | 13 | 12 | 11 | 10.5 | 10 |
| | -28 | 13 | 12 | 11 | 10.5 | 10 |
| | 29 | 13 | 12 | 11 | 10.5 | 10 |
| | -29 | 13 | 12 | 11 | 10.5 | 10 |
| | 30 | 13 | 12 | 11 | 10.5 | 10 |
| | -30 | 13 | 12 | 11 | 10.5 | 10 |
| | 31 | 13 | 12 | 11 | 11 | 11 |
| | -31 | 13 | 12 | 11 | 11 | 11 |
| | 32 | 15 | 14 | 13 | 12 | 11 |
| | -32 | 15 | 14 | 13 | 12 | 11 |
| Etc. | | | | | | |

DYNAMIC SELECTION OF SUITABLE CODES FOR VARIABLE LENGTH CODING AND DECODING

BACKGROUND OF THE INVENTION

1. Field of the Invention

The present invention relates to the field of data compression and decompression.

2. Description of the Prior Art

Graphics and video systems generate large amounts of data. This data is typically stored in 16 to 32 bit per pixel in external SDRAM and is accessed at a high rate. For an HD screen resolution of 1920×1080 and a display rate of 60 HZ, data traffic volumes of 237 to 475 MBytes/s are required. A range of different data compression methods have been devised to reduce this traffic.

Many of these data compression methods look at the probability of occurrence of various values and encode the most probable values with a short code and the less probable values with a longer code. This is called variable length encoding. The measure for attainable compression is expressed by Shannon's entropy or Shannon's information function:

$$H = -\sum_n Pr(A_n) \cdot \log^2(Pr(A_n)) \qquad (1)$$

Figure 1A:
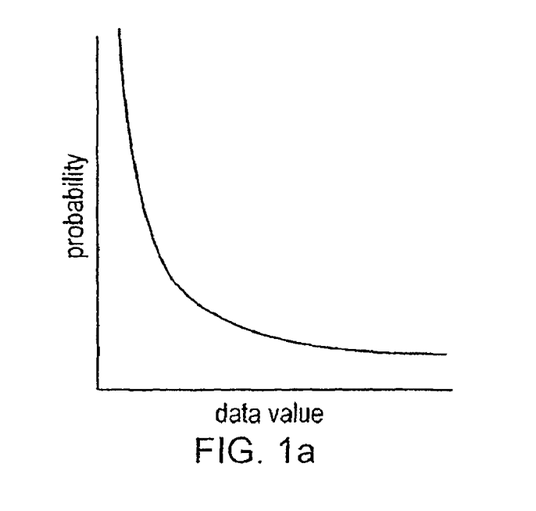
FIGS. 1a-1c show example probability density functions representative of statistical properties of example data signals.

Equation (1) shows that good compression can be obtained for data with a narrow probability density function such as that shown in FIG. 1a.

Figure 1B:
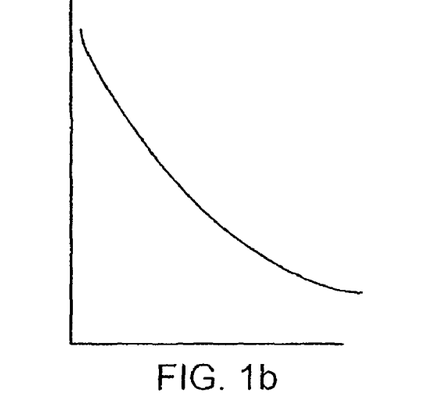

If however the probability density functions is wide, such as is shown in FIG. 1b, equation (1) shows that less compression is possible, or when the symbol distribution is bimodal (see FIG. 1c) then a feasible algorithm for the compression of data is not so straightforward and does not have the same advantages.

This problem has been addressed previously by applying a filtering function to the input data signal to reduce the entropy, thereby making the variable length coding more advantageous. Previous techniques have focussed on this filtering stage in order to minimise the entropy to the lowest possible levels and have applied complex calculations to find both an appropriate filter for a particular region of an image and have applied different filtering techniques for different regions. Schemes that apply different filters to different data regions are referred to as context adaptive schemes, the schemes adapting to the different contexts by applying different filtering techniques. Note that despite the computational effort the filtering does not provide compression per-se, it just forms a residual signal which allows for the application of a simple variable length code optimised for narrow distributions as depicted in FIG. 1a.

These techniques have been computationally costly, often requiring multiple passes over the data and intensive filtering of the local neighbourhood of the current symbol to determine the context. They therefore often require complex state-machines and controllers that are very specific to the source they are designed for. Furthermore, by paying little attention to the suitability of the actual variable length coder, they often result in sub-optimal bit allocation for all data sets of which the residual signal after filtering does not match the probability density function implied by the actual variable length coder.

Figure 1C:
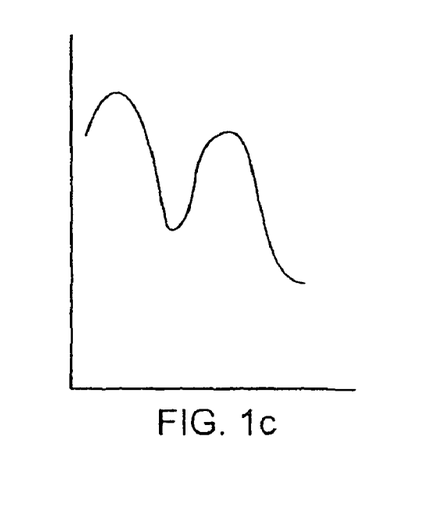

It would be desirable to be able to compress data in a simple manner which is not overly sensitive to this symbol statistics mismatch Moreover in the case that multiple variable length codes match to different probability density functions like those depicted in FIG. 1b and FIG. 1c, it would be desirable to have the ability to determine and realise the variable length code that implies the best matching probability density function, but without the complexity of context selection and adaptation required for the filter selection and adaptation.

SUMMARY OF THE INVENTION

Viewed from a first aspect, the present invention provides a data compressor for compressing a data signal comprising: compression circuitry for compressing said data signal using a plurality of variable length compression codes; a digital code select signal generator for generating a digital code select signal in response to an indicator signal indicating a preferred compression distribution, said digital code select signal selecting between at least some of said plurality of variable length compression codes, such that an average value of said digital code select signal corresponds to an average value of said indicator signal and a frequency of said digital code select signal is higher than a frequency of said indicator signal; said compression circuitry being responsive to said digital code select signal to select one of said plurality of compression codes in dependence upon a current value of said digital code select signal and to compress said data signal using said selected compression code.

It should be noted that each compression code is characterised by the bit assignment for each of the symbols of a given alphabet that it is encoding and is therefore characterised by a distribution of occurrence of these symbols. Thus, the indicator signal provides an indication of a desired compression distribution or bit allocation to be synthesised from the compression codes.

The present invention recognises that a good match to a preferred compression distribution that is identified by an indicator signal can be achieved even if only a few different compression codes are available, by the use of a digital select signal. This select signal has a higher frequency than the indicator signal that indicates the preferred compression distribution and is used to select between available compression codes to achieve an average compression which is close to the desired distribution. Thus, different compression codes are selected at different times according to a value of this higher frequency digital select signal. In this way on average a preferred compression code is synthesised. Thus, if for example the indicator signal indicates a preferred compression distribution that lies between two available compression codes, then the digital select signal will select one of the codes for some of the time and the other for the rest of the time thereby providing a better choice in compression coding than would be the case if either one had been selected all the time.

In some embodiments said indicator signal varies with the context of said data

The context of the data is an indication of a data region or data subset with locally consistent statistical properties. Thus, as the data regions moves, it may be that the context changes and different data values become more or less common. As the context changes the preferred compression schemes change and thus an indicator signal that changes with context is appropriate as different contexts have different preferred compression distributions.

In some embodiments, said data compressor further comprises: a filter with low pass frequency characteristics for receiving a reference signal and for generating said indicator signal, said indicator signal being indicative of the low frequency components of said reference signal, said reference signal being computed from said data signal.

Although the indicator signal can be generated in a number of ways in some embodiments it is generated from the low frequency components of a reference signal that is computed from the data signal. An indicator signal generated in this way provides a good indication of a preferred compression distribution.

In some embodiments, said data compressor further comprises a predictor filter with high pass characteristics for filtering said data signal to generate a filtered data signal with a lower entropy than said data signal; and wherein said reference signal is computed from said filtered data signal; and said compression circuitry compresses said filtered data signal using said selected compression code.

Although it is not essential for embodiments of the invention to use a predictor filter with high pass characteristics to generate a filtered data signal with a lower entropy it can be advantageous as such a signal can be more efficiently encoded using variable lengths encoding. If such a filter is used then the reference signal is computed from this filtered data signal and the compression circuitry compresses the filtered data signal using the selected compression code.

In some embodiments, said filter with low pass characteristics comprises a predictor filter with high pass characteristics for filtering said data signal to generate a filtered data signal with a lower entropy than said data signal and a zero count device for generating said indicator signal by calculating the proportion of zeros to non-zeros output by said predictor filter; and wherein said reference signal is computed from said filtered data signal; and said compression circuitry compresses said filtered data signal using said selected compression code.

Although the filter with low pass characteristics can be made up in a number of ways, in some embodiments it comprises a predictor filter with high pass characteristics for filtering the data signal and a zero count device for calculating the proportion of zeros to non-zeros output by the predictor filter. Inserting a predictor filter in the data signal path has the advantage of producing a data signal that can be variable length encoded more efficiently, it also has the advantage of allowing the low pass filter to be generated by a combination of this device and a zero count device which counts the proportion of zero in the signal coming out of the predictor filter and uses this as the indicator signal. This signal provides an indication of how many zeros there are in the signal that is to be encoded and this is used to generate the digital code select signal as this information is highly relevant when selecting appropriate codes in variable length encoding. Variable length encoding encodes values using codes of different lengths, the more common values being given codes of shorter length. Knowing the number of zeros in the code enables one to select a code that encodes zeros with shorter or longer length codes depending on their frequency of occurrence. This is a simple way of selecting a code and generally provides an appropriate code for the signal.

The indicator signal can be a number of things as long as it provides an indication of a preferred compression distribution. It may for example be an external signal received by the data compressor, or it may be a parameterised constant generated from the data in some way or it may simply be a varying signal that indicates the preferred compression distribution.

In some embodiments it may be advantageous to input the indicator signal in the form of a desired compression distribution from outside the device as an external signal. This signal can then be used by embodiments of the invention to achieve suitable compression from perhaps only a small number of possible codes by using the digital select signal and selecting between different codes to produce on average the desired distribution.

In some embodiments, said plurality of compression codes comprise three or more codes, said compression circuitry comprising pre-selection circuitry, said pre-selection circuitry being responsive to a value of said indicator signal to select two compression codes for said compression circuitry to select between, said digital code select signal comprising a binary signal.

Although the digital code select signal can be a signal that selects between three or more codes, in some embodiments it is simply a binary signal that selects between two codes there being pre-selection logic that determines which the two appropriate codes are for that particular indicator signal.

In some embodiments, said plurality of compression codes comprise variable length codes each identifiable by a number of bits that they use to encode zero.

As embodiments of this invention select compression codes on the basis of the number of zeros in the code it is appropriate in some cases to use encodings that are identifiable by a number of bits that they use to encode zeros. Identifying a code in this way makes it easy to select the appropriate code where the proportion of zeros in the code is known and thus, a simple and effective manner of selecting an appropriate code can be used.

In some embodiments, said two compression codes selected between are compression codes that use different subsequent number of bits to encode zero.

The two different codes selected between using a binary signal may be codes that use subsequent numbers to encode zeros. Thus, if the probability of occurrence of the zero symbol are seen to lie between 0.25 and 0.50 the two codes used might be the one bit zero coding and the two bit zero coding codes. Alternatively they may be codes that use three bit values to encode zero and four bit values to encode zero for a probability of zero in the range of 0.0625 to 0.1250 and so on. In any case they should be subsequent numbers as embodiments of the present invention select between neighbouring codes using a digital signal to determine the proportion of one code that is selected over the proportion of the other depending on the value of the indicator signal.

Although the compression codes can have a number of forms, in some embodiments, said plurality of compression codes comprise codes meeting the Huffman efficiency bound.

Figure 4:
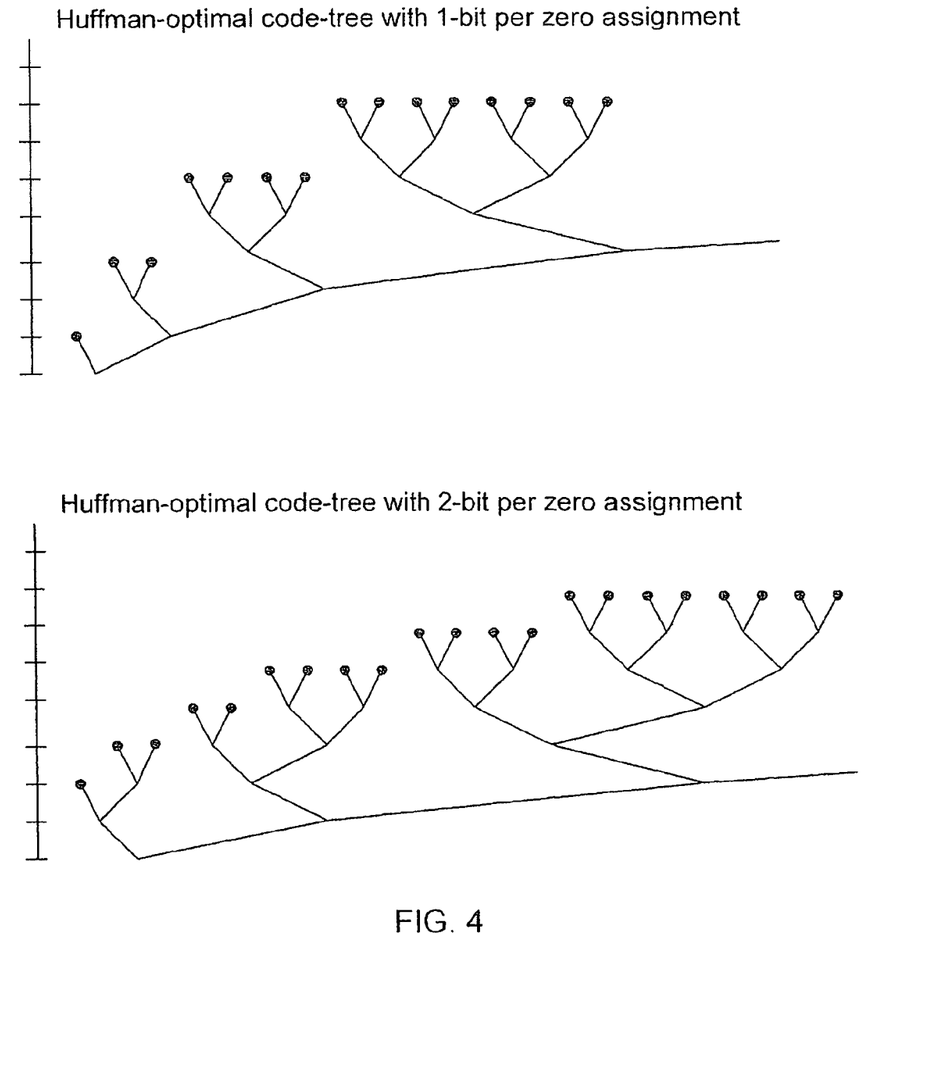
FIG. 4 shows Huffman trees representing two compression codes.

Huffman showed in the 1950's that a variable length compression scheme that met his bounds could not be improved upon for integer bit allocation. Only much later arithmetic coding was introduced which alleviates this need for integer allocation and thus may achieve a higher compression efficiency. Hence, if the scheme can be represented using a tree representation such as is shown in FIG. 4 then it meets the Huffman bounds and from this it follows that any code independent of the way it is computed is optimal for integer bit allocation if it can be represented as a Huffman tree and therefore meets the Huffman efficiency bound.

In some embodiments, said digital code select signal generator comprises a sigma delta device for generating a pseudo-random digital pattern from said indicator signal.

A sigma-delta device is a convenient device for generating a higher frequency coarsely quantised digital signal from a lower frequency but finely quantised or continuous signal, the signals having the same average value. Thus, it can be used to generate a signal that can be used to select between two codes that the average value of the signal lies between. Thus, both codes are appropriate and using both for a variable length of time is even more appropriate. It should be noted that sigma-delta devices can be described as delta-sigma devices, or closed loop digital Voltage Controlled Oscillator (VCO) devices as digital circuitry or as Van der Pol generators with analogue circuitry and as will be clear to the skilled person provided they have the required properties of providing a higher frequency signal which switches between values but provides an average value that is the same as the average value of the input signal, all these devices would be appropriate to be used as the digital code select signal generator In some embodiments, said data signal comprises a sequence of images, and said reference signal is computed from a previous image in said sequence of images to said image currently being compressed.

The data signal can comprise a number of forms but embodiments of the invention are particularly useful for compressing a sequence of images perhaps generated as a video or as computer generated graphic images. In such a case, the reference signal can be computed from a previous image and assuming that this image is in a sequence the next image will be similar and thus, this reference signal will be relevant when deciding on the compression codes.

In some embodiments, said reference signal is computed from an earlier portion of said data signal corresponding to a portion of said image currently being compressed.

The reference signal can be a number of things but in many embodiments it is computed from an earlier portion of the data signal that corresponds to a portion of the image that is currently being compressed. Thus, if you have a data signal that is not changing very quickly, earlier corresponding portions of that data signal can be used to generate a reference signal that is appropriate for selecting the compression codes for the corresponding later portion of the data signal.

In some embodiments, said data signal comprises a sequence of images and said reference signal is computed from a portion of a previous image in said sequence of images corresponding to a portion of said image currently being compressed.

When the data signal is a sequence of images, a portion of an earlier image is probably closely related to the same portion of a later image and as such, a reference signal can be generated from this portion and this can be used in the selection of the appropriate compression codes for the portion of the later image.

In some embodiments, said digital code select signal generator generates a digital code select signal having a frequency such that a digital value is generated for each sample of said data signal.

The digital code select signal generator generates a digital code select signal that has a frequency that is higher than the indicator signal that it generates this signal from. In such a way, it can select between different codes so that on average an appropriate code is used. The frequency of this signal can vary, but it may be such that a digital value is generated for each sample of the data signal. A sample may for example be a colour of a pixel or any other suitable portion of a data signal.

A second aspect of the present invention provides a data decompressor for decompressing a compressed data signal, said compressed data signal being a data signal compressed by a data compressor according to a first aspect of the present invention, said data decompressor comprising: decompression circuitry for decompressing said compressed data signal using a plurality of decompression codes being an inverse of said plurality of compression codes of said data compressor; a digital decode select signal generator for generating a digital decode select signal from an indicator signal, a frequency of said digital code select signal being higher than a frequency of said indicator signal and an average value of said digital decode select signal corresponding to an average value of said indicator signal; said decompression circuitry being responsive to said digital code select signal to select between one of said plurality of decompression codes in dependence upon a current value of said digital decode select signal and to decompress said filtered signal using said selected decompression code.

It should be noted that the data decompressor needs to be related to the data compressor as would be clear to a skilled person. Thus, the decompression codes used are the inverse of the compression codes and in embodiments of the invention the filter of low pass characteristics and the digital decode select signal generators should be the same as those used in the compressor.

Furthermore, if the compressor comprised a predictor filter then the decompressor should have a corrector filter that is the inverse of the predictor filter.

A third aspect of the present invention provides a system comprising a data compressor according to a first aspect of the present invention and a data de-compressor according to a second aspect of the present invention.

A fourth aspect of the present invention provides a method for compressing a data signal, said method comprises the steps of: generating a digital code select signal from an indicator signal indicating a preferred compression distribution, a frequency of said digital code select signal being higher than a frequency of said indicator signal and an average value of said digital code select signal corresponding to an average value of said indicator signal; in dependence upon a current value of said digital code select signal selecting between one of said plurality of compression codes; and compressing said data signal using said selected compression code.

A fifth aspect of the present invention provides a method for decompressing a compressed data signal, said compressed data signal being a data signal compressed by a fourth aspect of the present invention, said method comprising the steps of: generating a digital decode select signal from an indicator signal indicating a preferred compression distribution, a frequency of said digital decode select signal being higher than a frequency of said indicator signal and an average value of said digital decode select signal corresponding to an average value said indicator signal; in dependence upon a current value of said digital decode select signal selecting between one of said plurality of decompression codes; and decompressing said compressed data signal using said selected decompression code.

A sixth aspect of the present invention provides a computer program product which is operable when run on a data processor to control the data processor to perform the steps of the method according to either a fourth or fifth aspect of the present invention.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 2:
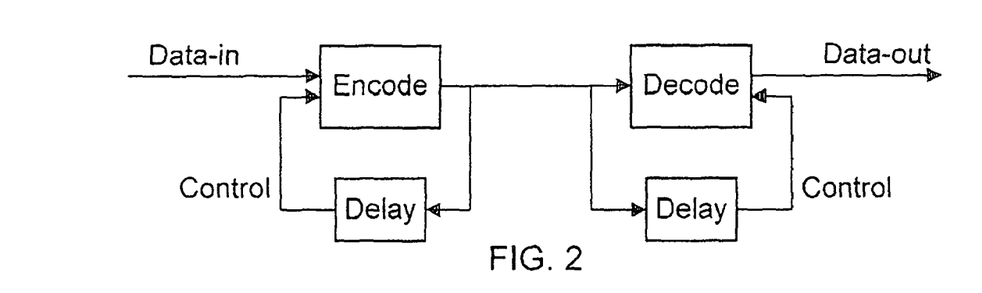
FIG. 2 schematically shows generic encoding and decoding of a signal involving signal dependent adaptation.

FIG. 2 schematically shows a system according to an embodiment of the present invention comprising an encoder for compressing the data signal received and a decoder for decompressing it that allows for signal dependent adaptation. Although not shown between these two there would be some storage or transmission of data which make the compression of the data important. The encoded data signal is sent back to the encoder via a delay as a control signal. This is a very schematic representation and in reality the delayed signal that is sent through the feedback loop may not be the encoded data but may be one or more parameters representative of the encoded data.

Figure 3:
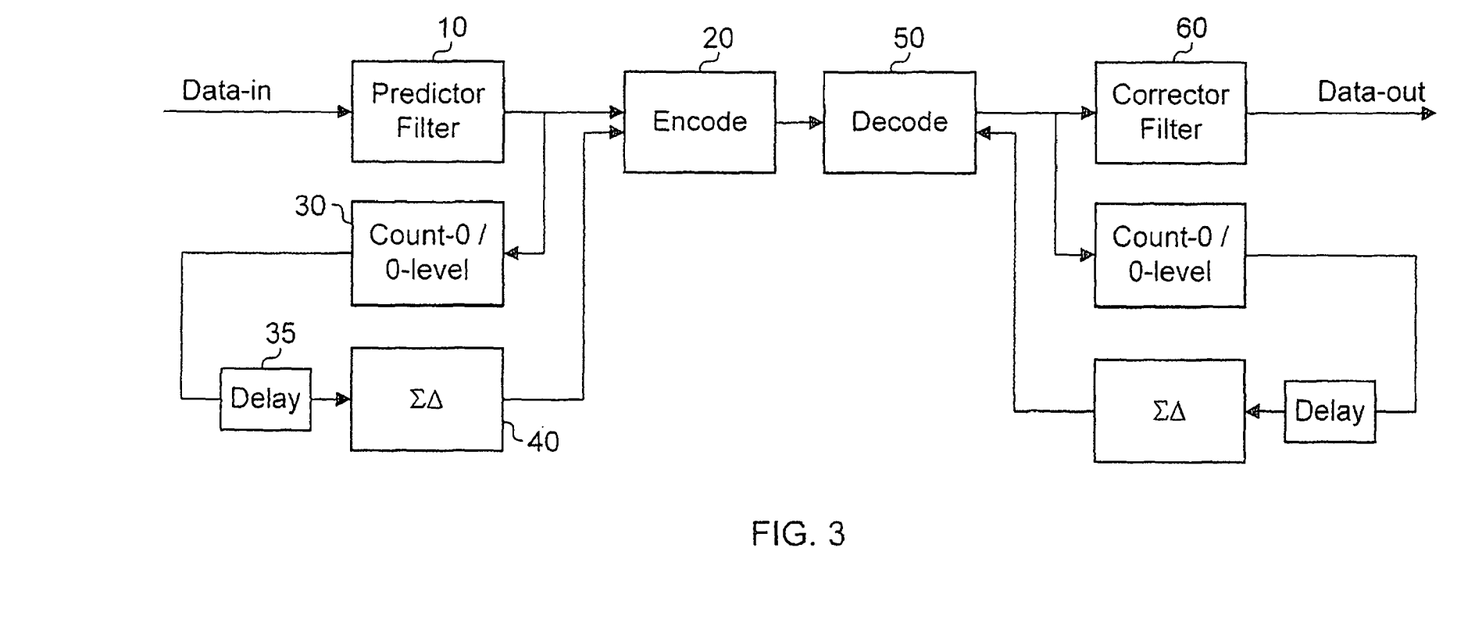
FIG. 3 shows an encoder and decoder involving signal dependent adaptation according to an embodiment of the present invention.

FIG. 3 shows the embodiment of the present invention in greater detail. A data signal is received and is passed through a high pass predictor filter 10 which serves to generate a signal that has a lower entropy. This is done as signals with lower entropy can be more efficiently encoded using variable length encoding as has been explained in the introduction to this application. This filtered signal is sent on to the encoder 20 where it is compressed. It is also sent via a loop where a control signal for the encoder 20 is generated. This loop comprises a zero count device 30 that monitors the signal from the predictor filter and outputs a reference signal which is indicative of the proportion of zeros in the signal relative to non-zeros. This signal then passes through a delay element 35 and into a sigma delta generator 40. The sigma delta generator 40 is a chaotic device that generates a binary control signal from the input data which has a same average value as the input signal it receives but switches between two levels. These two levels are used to determine which of two compression code the encoder 20 selects.

FIG. 4 shows two examples of variable length codes represented by their Huffman tree form. These two examples are a code with an assignment of one bit for a zero and a code with an assignment of two bits for a zero. If the input control signal to encoder 20 indicates that there is a high zero count in the filtered data signal then the signal from the sigma delta generator 40 will be used by the encoder 20 to select between these two codes, the particular one of these two codes being selected in accordance with the value of the signal output by the sigma delta generator 40. If there are not so many zeros in the reference signal then different codes not illustrated in FIG. 4 will be selected between. Representing the zero symbol with less than one bit for a zero can be obtained by a pre-coding step where a group of symbols is encoded together. This is a specialisation of the aforementioned approach.

In this way, the zero count provides an indication of the number of zeros in the signal and the sigma delta generator 40 produces a signal switching between two values each indicative of the number of zeros in the code and therefore suitable for allocating suitable compression codes for the signal. In this case, the control signal output by the sigma delta generator 40 is a zero count on the image region to which the context is applied measured in the previous frame. This is achieved by using the delay device 35. A selection of the number of bits for the zero symbol effectively fixes the rest of the allocation so there is no need to have an elaborate probability function model. Furthermore, as the codes that are used meet the Huffman bound as can be seen from the Huffman trees in FIG. 4 they cannot be improved upon without using arithmetic coding. It should be noted that the practical encoder does not use these trees, but any code that meets the Huffman bound can be represented in this way.

Thus, the level of the reference signal sets the output of the sigma delta generator 40 and two appropriate compression codes are thereby selected by the encoder. The encoder 20 switches between the two so that the overall value of the codes selected relates to the level of the reference signal. If the reference signal indicates many zeros then the codes illustrated in FIG. 4 are selected with the one bit assignment being selected more often than the lower code.

As can be appreciated, in this way rather than having to select only one of the two compression codes a mixture of the two can be selected according to a number of zeros counted by zero count device 30. When the signal changes and the zero count device 30 outputs a different reference signal then the sigma delta generator 40 also changes its output and different compression codes may be selected by encoder 20.

In this embodiment a previous image from a sequence of images is used as the reference signal but it would be clear to a skilled person that other reference signals can be used.

The output compressed signal is then used in some way, possibly transmitted between devices or stored in a memory and later when it is required again it is decoded by decoder 50. Decoder 50 decompresses the code using decompression codes that are equivalent to the compression codes of encoder 20. In order to select which to use it generates a reference signal in the same way that the reference signal is generated by the encoding side of the device. To initially decompress the first image an initial reference value is required. In this embodiment this system is always initialised in a known state common to both encoder and decoder and thus, the decoder 50 will know in advance the initial value of the reference signal and thus, the first frame can be decompressed and then this frame can be used to generate a reference signal to select a decompression code for later images. The decompressed images are then output by a corrector filter 60 which is an inverse of predictor filter 10 and the data signal is thus regenerated.

Figure 5A:
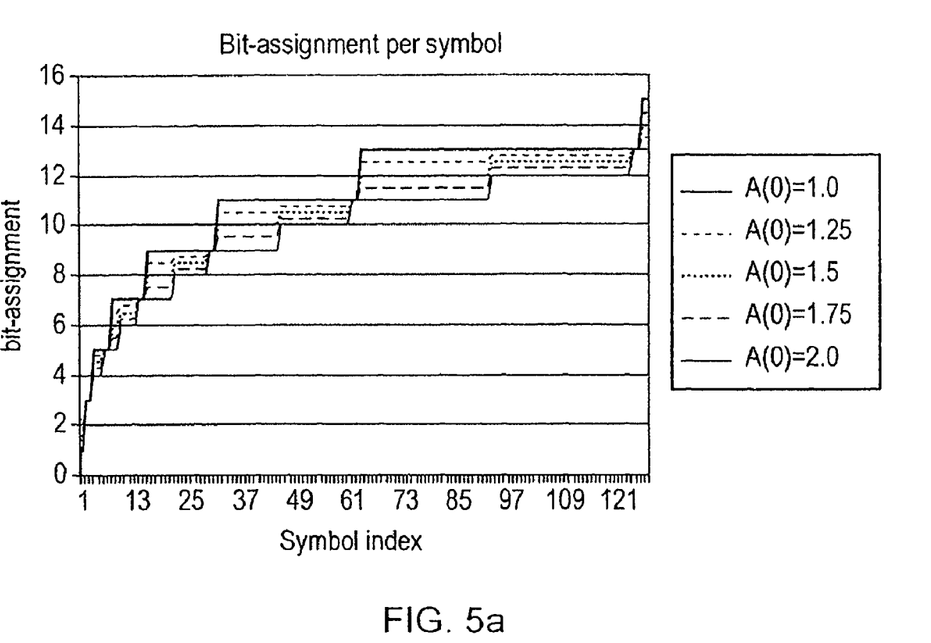
FIG. 5a is a graph showing the average bit assignment for the symbols given the assignment for zero A(0) as an effect of switching between the codes described by FIG. 4.

FIG. 5a shows a graph showing curves for different zero bit assignments including the two codes A(0)=1.0 and A(0)=2.0 represented by the trees in FIG. 4. The other curves represent the other levels that are synthesised by the higher rate switching between these two performed by the delta sigma device.

Figure 5B:
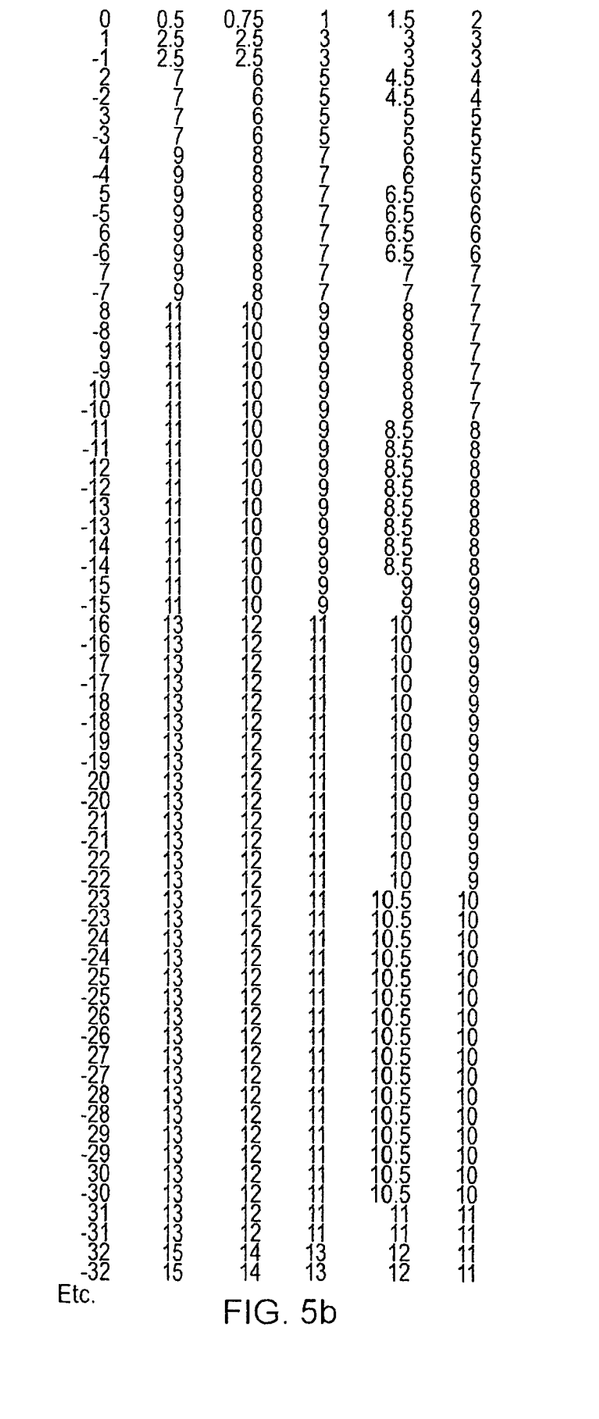
FIG. 5b is table giving numerical bit assignment for the symbols as an effect of switching between the codes described by FIG. 4.

FIG. 5b shows a table indicating different bit allocations for different values. As can be seen if zeros are common then fewer bits can be selected to represent the zeros, however this means that more bits are required to represent other values. The first two columns represent the coding of the zero symbol with less then one bit, using a single bit pre-coding specialisation as mentioned above.

Figure 6:
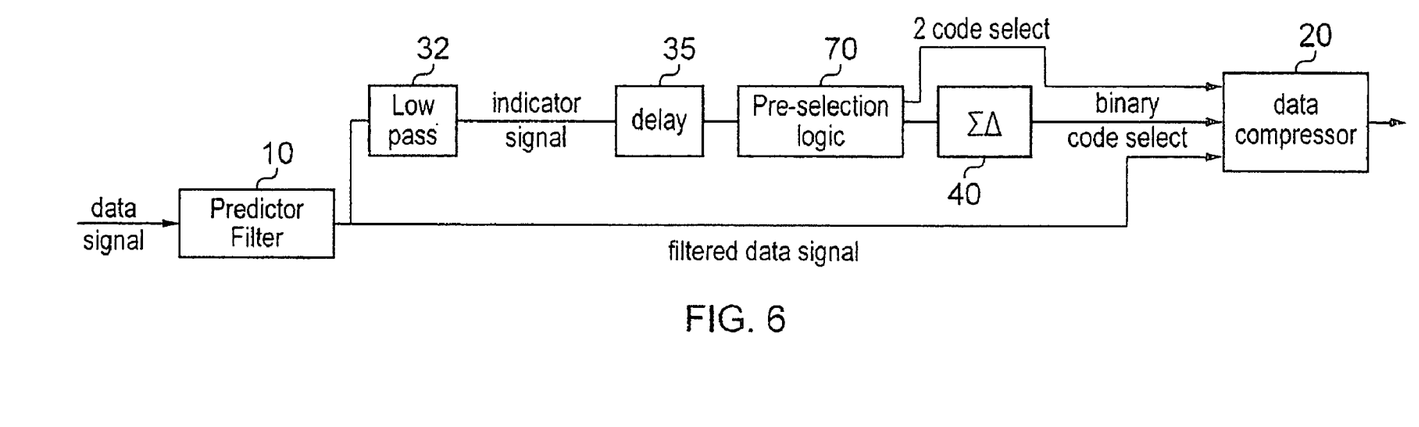
FIG. 6 shows a data compressor according to an embodiment of the present invention.

FIG. 6 shows an alternative data compressor according to an embodiment of the present invention. Like FIG. 3 this embodiment comprises a predictor filter 10 which is a high pass filter for narrowing the probability density function of the input data signal. The filtered data signal is then sent to data compressor 20. It is also sent via a low pass filter 32 through a delay device 35 to pre-selection logic 70. In this case, rather than having a zero count device a low pass filter is used to forward the low frequency characteristics of the input signal. This signal is delayed through delay device 35 which can appear anywhere on this control signal line and then enters pre-selection logic 70. Pre-selection logic 70 selects which two codes the data compressor 20 should switch between and this depends on the level of the indicator signal which indicates the proportion of zeros in the signal.

The signal is also input to a sigma delta generator 40 which in this embodiment outputs a binary code select signal. Thus, the output of the sigma delta generator 40 is in this embodiment a binary signal which the data compressor 20 uses to select between one of two codes, the two codes selected between being determined by a value output by pre-selection logic 70. Thus, these control signals are sent to data compressor 20 along with the filtered data signal and the compressed data is then generated and output. This will be decompressed in a similar way with decompression shown in FIG. 3.

Figure 7:
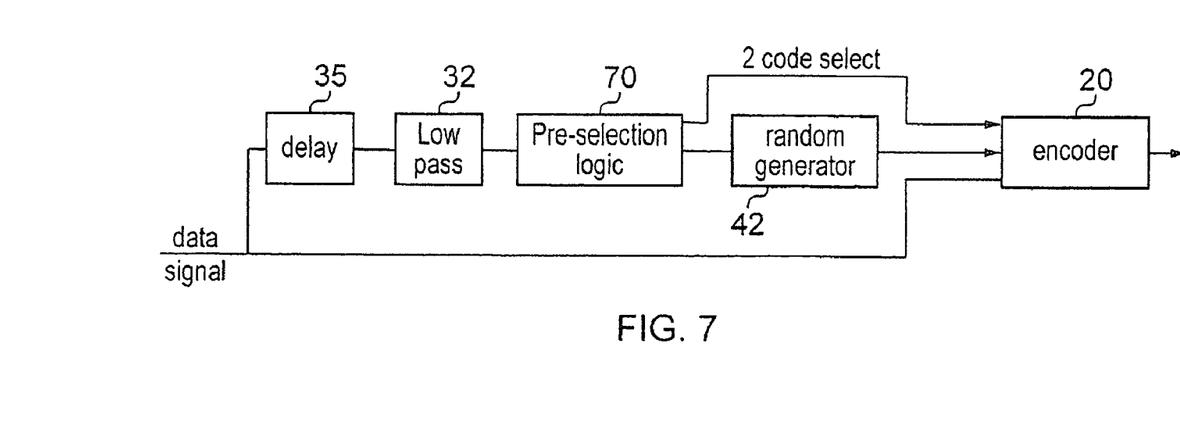
FIG. 7 shows a data compressor according to another embodiment of the present invention.

FIG. 7 shows a compression device according to an alternative embodiment of the present invention. In this embodiment, the data signal that is input is not sent through a high pass filter to reduce its entropy and correspondingly narrow the probability density function of the signal. One advantage of embodiments of the present invention is that they are able to compress data with higher entropy and a corresponding wider probability density functions and for this reason, they do not use complicated calculations to generate a narrow probability density function but rather deal with wider probability density functions. For this reason, although it may be advantageous to send the data signal through a predictor filter to generate a narrower probability density function signal it is not necessary and in some embodiments the predictor filter is not used. Thus, in this embodiment the data signal is sent directly to encoder 20 and it is also sent on a control path via delay device 35 through a low pass filter 32 through pre-selection logic 70 which selects one of two codes and then through random generator 42. Random generator 42 acts in a similar way to the sigma delta device of the previous embodiment to generate a binary signal from the input data this binary signal indicating which of the two codes selected by the pre-selection unit logic the encoder 20 should use at any one time.

Figure 8:
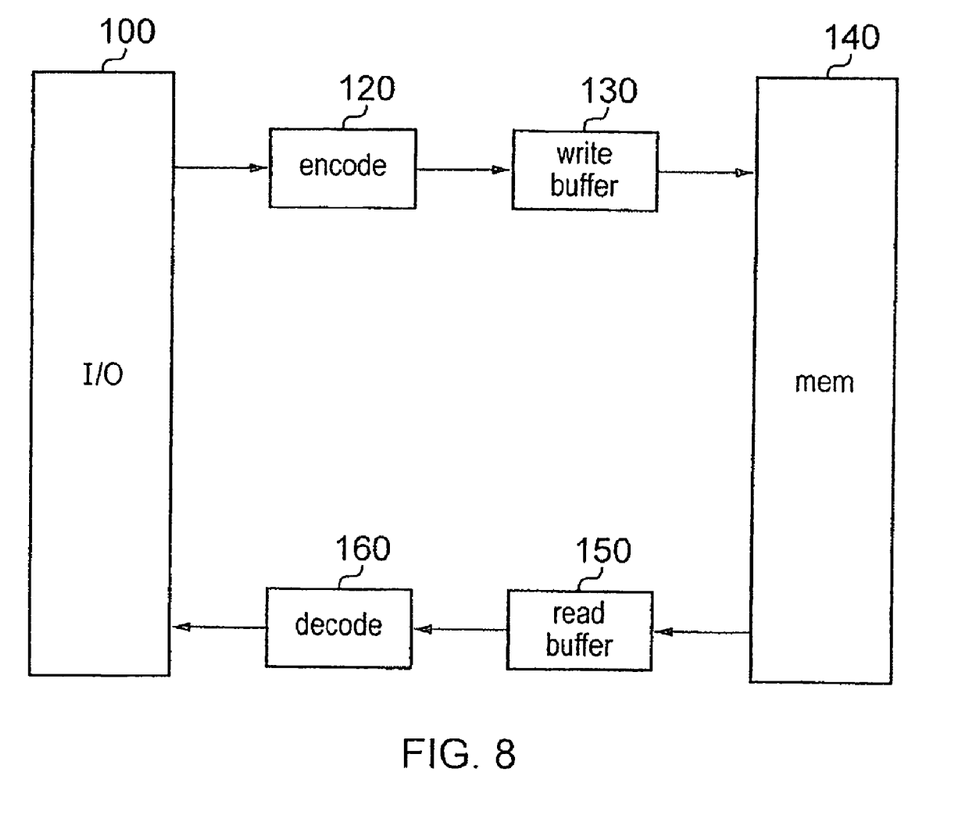
FIG. 8 shows a system using a data compressor and decompressor of an embodiment of the present invention.

FIG. 8 shows a device for storing compressed data in which embodiments of the present invention can be used. This device comprises an input/output device 100 for receiving and outputting data. It comprises an encode device 120 for compressing or encoding the data received and a write buffer 130 for writing the compressed data to memory 140. When the data is required to be output read buffer 150 reads the data required from memory 140 and it is decompressed using decoder 160 and output via input/output device 100. Encoder 120 and decoder 160 are devices that are the same as or are similar to those shown in FIG. 3 or FIGS. 6 to 7.

Figure 9:
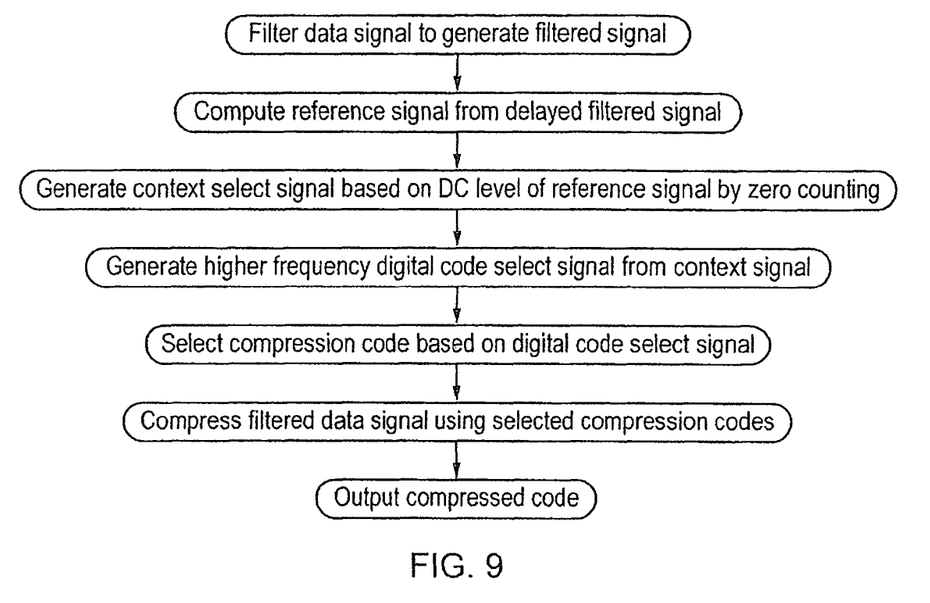
FIG. 9 shows a flow diagram illustrating steps in a compression method according to an embodiment of the present invention.

FIG. 9 shows a flow diagram indicating a method of compressing data according to an embodiment of the present invention. Initially a data signal is received and it is filtered to generate a filtered signal using a high pass filter. The object of this is to reduce the entropy and therefore make the encoding using variable length coding more efficient.

A reference signal is then computed from the delayed filtered signal and this is zero counted to generate an indicator signal indicative of the number of zeros within the reference signal. Given that this is the delayed data signal what this indicates is the proportion of zeros in an earlier version of the data signal. A higher frequency digital code select signal is then generated from this indicator signal. This select signal varies between several levels, these levels indicating which compression code would be most appropriate to compress that portion of the signal. In this embodiment, the compression code selected is selected based on the number of zeros in this previous portion of the signal which it is assumed will be similar to the number of zeros in the current signal. The proportion of zeros in a signal can be used to select an appropriate compression code where these compression codes are identified by the number of bits used to encode the zeros. This is a simple way to classify these codes and enables an appropriate selection of codes. Thus, if there are many zeros in a signal a code that uses few bits to identify a zero would be appropriate whereas with a signal with fewer zeros a compression code that uses many bits to encode a zero would be more appropriate.

Thus, compression codes are selected based on the current value of the digital code select signal. This digital code select signal has a higher frequency than the indicator signal and thus, the code selected can vary between several values which provides a finer selection of codes which can improve the compression.

The compressed code is then output.

Figure 10:
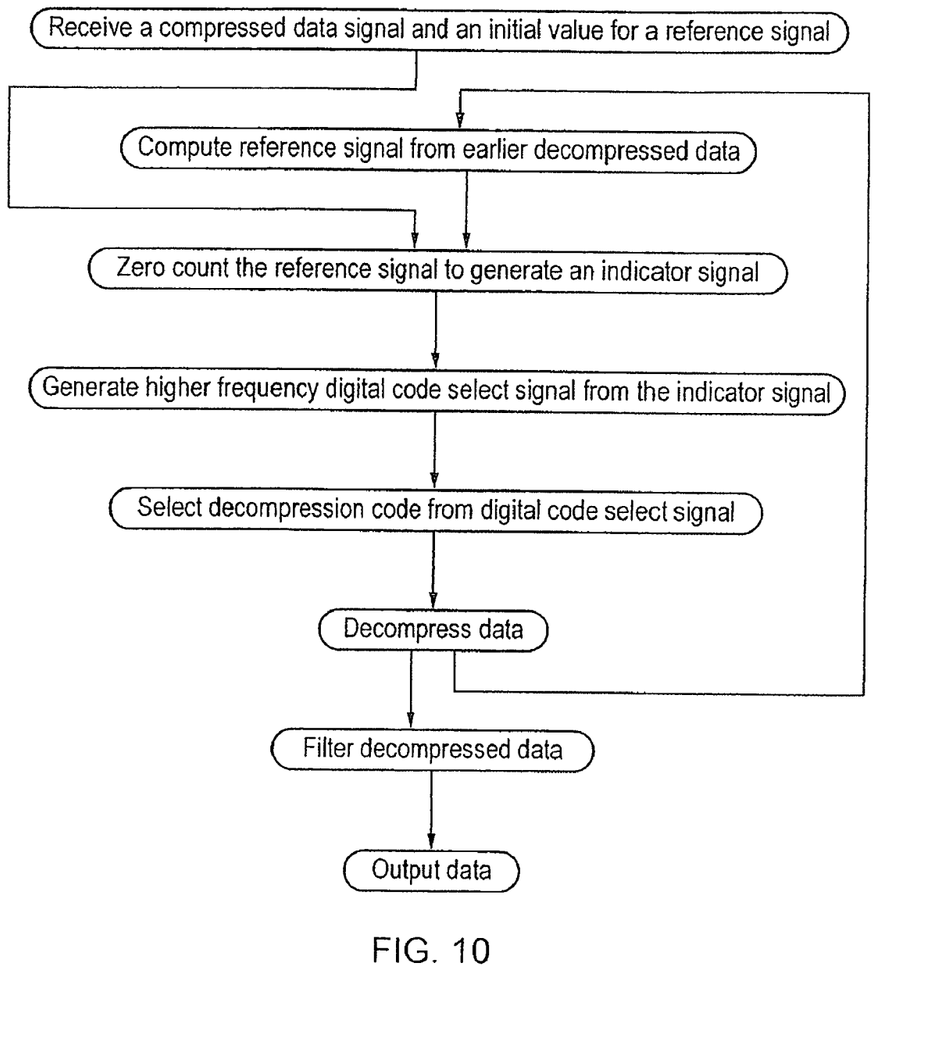
FIG. 10 shows a flow diagram illustrating steps in a decompression method according to an embodiment of the present invention.

FIG. 10 shows a flow diagram illustrating the complementary decompression method for decompressing the data compressed by the method shown in FIG. 9. Initially the compressed data signal is received and also an initial value for the reference signal is received. In some embodiments the initial value for the reference signal may not be received but may be encoded within the decoder. Using this initial value the reference signal is zero counted to generate an indicator signal and from this a higher frequency digital decode select signal is generated. This selects the appropriate decompression code and the data signal is decompressed using this code. This decompressed code is then sent back to the system and is zero counted to generate a new indicator signal for later data. The decompressed data signal is also then passed through a correction filter that has an inverse function to the filter used in compression and the data signal is output.

In summary embodiments of the present invention produce a simple controller that measures the long term averaged DC level of past data (e.g. the occurrence of zero after differential encoding which is equivalent to high pass filtering) and uses this DC level to drive a sigma delta coder, whose output is used to select at a high random rate one out of multiple preferred integer allocation schemes.

Provided the statistics of the sigma-delta signal are sufficiently uncorrelated with the statistics of the input data, this scheme yields the optimal or at least a good fractional allocation for the zero symbol and by virtue of that, a minimal or at least a reduced bit allocation for all remaining symbols.

A particular advantage of this system is that it achieves this result with a low complexity compared to conventional context adaptive schemes and it is highly insensitive to symbol statistics mismatch. Embodiments simply make the best out of a possibly lousy situation.

Thus, better compression compared to schemes of comparable complexity is achieved, with equivalent compression for less complexity and as a bonus robustness against modelling mismatch. Furthermore, due to the simple controller the scheme can be used in high throughput streaming real-time online applications such as a video/graphics framebuffer, where more complex schemes would have properties/requirements that conflict with such an application.

Some advantages include optimising or at least improving both peak and average compression ratios, and it is especially good at picking up typical mobile GUI background schemes.

It should be noted that for good random statistics the sigma delta device used should be at least of order two. A second order sigma delta device can faithfully reproduce AC signals with a bandwidth of less than $\frac{1}{16}^{th}$ the sigma delta output rate, thus one can change context at each 16-pixel boundary, provided the steering signal is present for each section. A second order sigma delta cannot operate rail to rail, so the internal representation must have one extension bit. The sigma delta can produce a single bit control when operating in between two probability density functions or it can directly give a multi-bit output effectively selecting a probability density function on the fly.

Various further aspects and features of the present invention are defined in the appended claims. Various modifications can be made to the embodiments herein before described without departing from the scope of the present invention.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A data compressor for compressing a data signal comprising:
   (i) compression circuitry for compressing said data signal using a plurality of variable length compression codes;
   (ii) a digital code select signal generator for generating a digital code select signal in response to an indicator signal indicating a preferred compression distribution, said digital code select signal selecting between at least some of said plurality of variable length compression codes, such that an average value of said digital code select signal corresponds to an average value of said indicator signal and a frequency of said digital code select signal is higher than a frequency of said indicator signal;
   (iii) said compression circuitry being responsive to said digital code select signal to select one of said plurality of compression codes in dependence upon a current value of said digital code select signal and to compress said data signal using said selected compression code.

2. A data compressor according to claim 1, wherein said indicator signal varies with a context of said data.

3. A data compressor according to claim 1, further comprising;
   (i) a filter with low pass frequency characteristics for receiving a reference signal and for generating said indicator signal, said indicator signal being indicative of the low frequency components of said reference signal, said reference signal being computed from said data signal.

4. A data compressor according to claim 3, said data compressor further comprising:
   (i) a predictor filter with high pass characteristics for filtering said data signal to generate a filtered data signal with a lower entropy than said data signal; and wherein
   (ii) said reference signal is computed from said filtered data signal; and
   (iii) said compression circuitry compresses said filtered data signal using said selected compression code.

5. A data compressor according to claim 3, wherein said filter with low pass characteristics comprises a predictor filter with high pass characteristics for filtering said data signal to generate a filtered data signal with a lower entropy than said data signal and a zero count device for generating said indicator signal by calculating the proportion of zeros to non-zeros output by said predictor filter; and wherein
   (i) said reference signal is computed from said filtered data signal; and
   (ii) said compression circuitry compresses said filtered data signal using said selected compression code.

6. A data compressor according to claim 1, wherein said indicator signal comprise an external signal received at an input of said data compressor.

7. A data compressor according to claim 1, wherein said plurality of compression codes comprise three or more codes, said compression circuitry comprising pre-selection circuitry, said pre-selection circuitry being responsive to a value of said indicator signal to select two compression codes for said compression circuitry to select between, said digital code select signal comprising a binary signal.

8. A data compressor according to claim 1, wherein said plurality of compression codes comprise variable length codes each identifiable by a number of bits that they use to encode zero.

9. A data compressor according to claim 8, wherein said plurality of compression codes comprise three or more codes, said compression circuitry comprising pre-selection circuitry, said pre-selection circuitry being responsive to a value of said indicator signal to select two compression codes for said compression circuitry to select between, said digital code select signal comprising a binary signal, wherein said two compression codes selected between are compression codes that use different subsequent number of bits to encode zero.

10. A data compressor according to claim 1, wherein said plurality of compression codes comprise codes meeting the Huffman efficiency bound.

11. A data compressor according to claim 1, wherein said digital code select signal generator comprises a sigma delta device for generating a pseudo-random digital pattern from said indicator signal.

12. A data compressor according to claim 1, wherein said data signal comprises a sequence of images, and said indicator signal is computed from a previous image in said sequence of images to said image currently being compressed.

13. A data compressor according to claim 1, wherein said data signal comprises a sequence of images and said indicator signal is computed from an earlier portion of said data signal corresponding to a portion of said image currently being compressed.

14. A data compressor according to claim 12, wherein said indicator signal is computed from a portion of a previous image in said sequence of images corresponding to a portion of said image currently being compressed.

15. A data compressor according to claim 1, wherein said digital code select signal generator generates a digital code select signal having a frequency such that a digital value is generated for each sample of said data signal.

16. A data decompressor for decompressing a compressed data signal, said compressed data signal being a data signal compressed by a data compressor according to claim 1, said data decompressor comprising:

(i) decompression circuitry for decompressing said compressed data signal using a plurality of decompression codes being an inverse of said plurality of compression codes of said data compressor;

(ii) a digital decode select signal generator for generating a digital decode select signal from an indicator signal, a frequency of said digital code select signal being higher than a frequency of said indicator signal and an average value of said digital decode select signal corresponding to an average value of said indicator signal;

(iii) said decompression circuitry being responsive to said digital code select signal to select between one of said plurality of decompression codes in dependence upon a current value of said digital decode select signal and to decompress said filtered signal using said selected decompression code.

17. A data decompressor according to claim 16, for decompressing a data signal compressed by a data compressor comprising:

(i) compression circuitry for compressing said data signal using a plurality of variable length compression codes;

(ii) a digital code select signal generator for generating a digital code select signal in response to an indicator signal indicating a preferred compression distribution, said digital code select signal selecting between at least some of said plurality of variable length compression codes, such that an average value of said digital code select signal corresponds to an average value of said indicator signal and a frequency of said digital code select signal is higher than a frequency of said indicator signal;

(iii) said compression circuitry being responsive to said digital code select signal to select one of said plurality of compression codes in dependence upon a current value of said digital code select signal and to compress said data signal using said selected compression code;

(iv) a filter with low pass frequency characteristics for receiving a reference signal and for generating said indicator signal, said indicator signal being indicative of the low frequency components of said reference signal, said reference signal being computed from said data signal; wherein said data decompressor further comprises a filter of low pass characteristics for generating said indicator signal from a reference signal, said reference signal being computed from an output of said decompression circuitry.

18. A data decompressor according to claim 16 for decompressing a data signal compressed by a data compressor comprising:

(i) compression circuitry for compressing said data signal using a plurality of variable length compression codes;

(ii) a digital code select signal generator for generating a digital code select signal in response to an indicator signal indicating a preferred compression distribution, said digital code select signal selecting between at least some of said plurality of variable length compression codes, such that an average value of said digital code select signal corresponds to an average value of said indicator signal and a frequency of said digital code select signal is higher than a frequency of said indicator signal;

(iii) said compression circuitry being responsive to said digital code select signal to select one of said plurality of compression codes in dependence upon a current value of said digital code select signal and to compress said data signal using said selected compression code;

(iv) a filter with low pass frequency characteristics for receiving a reference signal and for generating said indicator signal, said indicator signal being indicative of the low frequency components of said reference signal, said reference signal being computed from said data signal;

(v) a predictor filter with high pass characteristics for filtering said data signal to generate a filtered data signal with a lower entropy than said data signal; and wherein (vi) said reference signal is computed from said filtered data signal; and (vii) said compression circuitry compresses said filtered data signal using said selected compression code;

said data decompressor further comprising a corrector filter that is an inverse to said predictor filter for filtering said decompressed compressed data signal to generate said data signal.

19. A data decompressor according to claim 16, wherein said plurality of decompression codes comprise three or more codes, said decompression circuitry comprising pre-selection circuitry, said pre-selection circuitry being responsive to a value of said indicator signal to select two decompression codes for said decompression circuitry to select between, said digital code select signal comprising a binary signal.

20. A data decompressor according to claim 17, wherein said indicator signal comprises a signal representative of a proportion of zeros to non-zeros in said reference signal.

21. A data decompressor according to claim 16, wherein said digital decode select signal generator comprises a sigma delta device for generating a pseudo-random digital pattern from said indicator signal.

22. A data decompressor according to claim 17, wherein said reference signal is computed from an earlier portion of said data signal corresponding to a portion of said data signal currently being decompressed.

23. A data decompressor according to claim 22, wherein said data signal comprises a sequence of images and said reference signal is computed from a portion of a previous image in said sequence of images corresponding to a portion of said image currently being decompressed.

24. A system comprising a data compressor according to claim 1 and a data decompressor comprising:

(i) decompression circuitry for decompressing said compressed data signal using a plurality of decompression codes being an inverse of said plurality of compression codes of said data compressor;

(ii) a digital decode select signal generator for generating a digital decode select signal from an indicator signal, a frequency of said digital code select signal being higher than a frequency of said indicator signal and an average value of said digital decode select signal corresponding to an average value of said indicator signal;

(iii) said decompression circuitry being responsive to said digital code select signal to select between one of said plurality of decompression codes in dependence upon a current value of said digital decode select signal and to decompress said filtered signal using said selected decompression code.

25. A method for compressing a data signal, said method comprises the steps of:

(i) generating a digital code select signal from an indicator signal indicating a preferred compression distribution, a frequency of said digital code select signal being higher than a frequency of said indicator signal and an average value of said digital code select signal corresponding to an average value of said indicator signal;

(ii) in dependence upon a current value of said digital code select signal selecting between one of said plurality of compression codes; and (iii) compressing said data signal using said selected compression code.

26. A method according to claim 25, comprising the initial steps of:
   (i) computing a reference signal from said data signal;
   (ii) generating said indicator signal based on low frequency components of said reference signal.

27. A method according to claim 26, comprising an initial step of passing a data signal through a predictor filter of high pass characteristics to generate a filtered signal with a lower entropy than said data signal; and wherein
   (i) said reference signal is computed from said filtered data signal; and
   (ii) said step of compressing compresses said filtered data signal using said selected compression code.

28. A method for decompressing a compressed data signal, said compressed data signal being a data signal compressed by a method according to claim 21, said method comprising the steps of:
   (i) generating a digital decode select signal from an indicator signal, a frequency of said digital decode select signal being higher than a frequency of said indicator signal and an average value of said digital decode select signal corresponding to an average value said indicator signal;
   (ii) in dependence upon a current value of said digital decode select signal selecting between one of said plurality of decompression codes; and
   (iii) decompressing said compressed data signal using said selected decompression code.

29. A method for decompressing a compressed data signal according to claim 28, said method further comprising the initial steps of generating said indicator signal based on a reference signal, said reference signal being computed from an earlier portion of said compressed data signal that has been decompressed.

30. A method for decompressing a compressed data signal according to claim 29, wherein said compressed data signal is a data signal compressed by a compression method comprising:
   (i) passing a data signal through a predictor filter of high pass characteristics to generate a filtered signal with a lower entropy than said data signal;
   (ii) generating a digital code select signal from an indicator signal indicating a preferred compression distribution, a frequency of said digital code select signal being higher than a frequency of said indicator signal and an average value of said digital code select signal corresponding to an average value of said indicator signal;
   (iii) in dependence upon a current value of said digital code select signal selecting between one of said plurality of compression codes; and
   (iv) compressing said data signal using said selected compression code;
   (v) computing a reference signal from said data signal;
   (vi) generating said indicator signal based on low frequency components of said reference signal; wherein
   said reference signal is computed from said filtered data signal; and
   said step of compressing compresses said filtered data signal using said selected compression code; and said decompressing method comprises the further step of:
   filtering said decompressed compressed data signal using a corrector filter to generate said data signal.

31. A computer program product which is operable when run on a data processor to control the data processor to perform the steps of the method according to claim 25.

* * * * *